(12) United States Patent
Itoyama et al.

(10) Patent No.: US 8,545,291 B2
(45) Date of Patent: Oct. 1, 2013

(54) POLISHING PAD, MANUFACTURING METHOD THEREOF AND POLISHING METHOD

(75) Inventors: Kohki Itoyama, Saijyo (JP); Daisuke Takahashi, Saijyo (JP); Junichi Ueno, Nishigo-mura (JP); Syuichi Kobayashi, Nishigo-mura (JP)

(73) Assignees: Fujibo Holdings Inc., Chuo-Ku, Tokyo (JP); Shin-Etsu Handotai Co., Ltd., Chiyoda-Ku, Tokyo (JP)

( * ) Notice: Subject to any disclaimer, the term of this patent is extended or adjusted under 35 U.S.C. 154(b) by 0 days.

(21) Appl. No.: 13/379,588

(22) PCT Filed: Jun. 22, 2010

(86) PCT No.: PCT/JP2010/060521
§ 371 (c)(1),
(2), (4) Date: Dec. 20, 2011

(87) PCT Pub. No.: WO2010/150766
PCT Pub. Date: Dec. 29, 2010

(65) Prior Publication Data
US 2012/0100783 A1 Apr. 26, 2012

(30) Foreign Application Priority Data
Jun. 23, 2009 (JP) .................................. 2009-149190

(51) Int. Cl.
*B24B 37/04* (2012.01)
(52) U.S. Cl.
USPC ................................ 451/36; 451/28; 451/526
(58) Field of Classification Search
USPC ........ 451/36, 28, 526, 66; 61/296; 428/64.1, 428/66.2, 66.6, 304.4; 438/455, 409; 521/79
See application file for complete search history.

(56) References Cited

U.S. PATENT DOCUMENTS 6,143,628 A * 11/2000 Sato et al. ..................... 438/455
6,949,588 B2 * 9/2005 Park ................................ 521/79
(Continued)

FOREIGN PATENT DOCUMENTS

JP 2003-128910 A 5/2003
JP 2005-123232 A 5/2005
(Continued)

OTHER PUBLICATIONS

International Search Report (PCT/ISA//210) issued on Jul. 27, 2010, by Japanese Patent Office as the International Searching Authority for International Application No. PCT/JP2010/060521.
(Continued)

*Primary Examiner* — Lee D Wilson
(74) *Attorney, Agent, or Firm* — Buchanan Ingersoll & Rooney PC (57) ABSTRACT

A polishing pad capable of improving an affinity to polishing liquid and stabilizing polishing performance is provided. A polishing pad 10 is equipped with a urethane sheet 2. The urethane sheet 2 has a polishing surface P for polishing an object to be polished. The urethane sheet 2 is formed by a dry molding method and is formed by slicing a polyurethane foamed body which is obtained by reacting and curing mixed liquid in which an isocyanate-group containing compound, water, a foam control agent and a polyamine compound are mixed. Foams 3 are dispersed approximately uniformly inside the urethane sheet 2. Opened pores 4 which are opened parts of the foams 3 are formed at the polishing surface P. Inside the urethane sheet 2, the foams 3 formed adjacently to each other are communicated by communication holes 9, and the communication holes 9 are formed at a ratio of 800 holes/$cm^2$ or more when observed from a side of the polishing surface P. Polishing liquid moves via the communication holes 9 and the foams 3.

10 Claims, 2 Drawing Sheets

(56) References Cited

U.S. PATENT DOCUMENTS

| | | | |
|---|---|---|---|
| 8,043,520 B2 * | 10/2011 | Asakawa et al. | 216/56 |
| 8,247,466 B2 * | 8/2012 | Brown | 521/172 |
| 2005/0112354 A1 * | 5/2005 | Kume et al. | 428/304.4 |
| 2005/0118937 A1 | 6/2005 | Fukushima et al. | |
| 2008/0251061 A1 * | 10/2008 | Baratta | 125/15 |
| 2009/0093200 A1 | 4/2009 | Iwase et al. | |
| 2012/0100783 A1 * | 4/2012 | Itoyama et al. | 451/36 |

FOREIGN PATENT DOCUMENTS

| | | |
|---|---|---|
| JP | 2007-276061 A | 10/2007 |
| JP | 2009-101504 A | 5/2009 |
| JP | 2009-125894 A | 6/2009 |
| JP | 2009125895 A | 11/2009 |

OTHER PUBLICATIONS

Written Opinion (PCT/ISA/237) issued on Jul. 12, 2010, by Japanese Patent Office as the International Searching Authority for International Application No. PCT/JP2010/060521.

Japanese Notice of Reasons for Rejection dated Oct. 9, 2012 issued in the corresponding Japanese Patent Application No. 2009-149190 and English language translation.

Japanese Notice of Reasons for Rejection dated May 15, 2012 issued in the corresponding Japanese Patent Application No. 2009-149190 and English language translation.

* cited by examiner

POLISHING PAD, MANUFACTURING METHOD THEREOF AND POLISHING METHOD

FIELD OF THE INVENTION

The present invention relates to a polishing pad, a manufacturing method thereof and a polishing method, and in particular relates to a polishing pad in which a large number of foams are formed by a dry molding method and which has a resin foamed body where opened pores of the foams are formed at a polishing surface for polishing an object to be polished, a manufacturing method of the polishing pad and a polishing method using the polishing pad.

DESCRIPTION OF THE RELATED ART

Polishing work is being carried out by using a polishing pad for polishing a material for a semiconductor device, an electronic part or the like, especially, a surface (work surface) of a thin-type substrate (object to be polished) such as a Si substrate (silicon wafer), a GaAs (gallium arsenide) substrate, a substrate for glass, hard disk, LCD (liquid crystal display) or the like because these are required to have flatness. In the semiconductor device, as a degree of integration of semiconductor circuits increases rapidly, minuteness and multilayer wiring for the purpose of making density higher are advancing. For this reason, a technology for planarizing a work surface higher becomes important. While, in the glass substrate for LCD, as a LCD becomes larger, higher flatness of a work surface is required. As a request of flatness becomes higher, polishing performance such as polishing accuracy, polishing efficiency or the like in polishing work, in other words, performance required for a polishing pad becomes higher.

In polishing work, a polishing pad having a resin foamed body formed by a wet solidifying method (wet film forming method) or a dry molding method is used. Normally, in the wet solidifying method, after applying resin solution in which a resin such as a polyurethane resin or the like is dissolved into water-miscible organic solvent to a sheet-shaped base material, by replacing the organic solvent with water in aqueous solidifying liquid, a resin foamed body in which foams are continuously formed is obtained. By forming opened pores at a polishing surface due to buffing work or the like, polishing liquid (slurry) including abrasive grains which is supplied at a time of polishing work is released between a polishing surface and a work surface while it is also retained at the opened pores. Namely, in the resin foamed body formed by the wet solidifying method, cycling and retaining properties to polishing liquid are secured due to that the polishing liquid moves through the foams. However, as the polishing pad becomes worn away in polishing work, a diameter of the opened pores becomes larger at the polishing surface, which brings about a change in polishing performance. Further, because the foams are formed continuously, the resin foamed body may cause elastic fatigue when it is used repeatedly for polishing work. On the other hand, in the dry molding method, normally, by reacting a polyisocyanate compound, a polyol compound and a polyamine compound, a polyurethane foamed body in which foams are formed independently is obtained. Further, grooves may be formed at a polishing surface in order to improve properties of supplying polishing liquid and of discharging polishing dust brought about at polishing work.

However, the polyurethane foamed body formed by the dry molding method has a drawback in that polishing liquid is not affinitive to the polishing pad when polishing the surface of a silicon wafer or the like because the polyurethane foamed body has hydrophobicity inherently. Polishing liquid and polishing dust hardly move through the foams because the foams are formed independently. Accordingly, the polyurethane foamed body formed by the dry molding method is inferior to the polyurethane foamed body formed by the wet solidifying method in cycling and retaining properties to polishing liquid. For this reason, clogging is apt to occur at the opened pores due to polishing liquid or polishing dust, which may bring about not only lowering of polishing performance but also lowering of flatness due to a scratch or the like occurred at a work surface of an object to be polished. In order to improve the supplying and retaining properties to polishing liquid, it is possible to increase the number of the opened pores or grooves. But, this rather loses elasticity of the polishing pad, and may lower the flatness of the object to be polished. Besides, it lowers polishing performance because discharging of the polishing liquid is promoted in proportion to the increased number of the opened pores or grooves. Further, in a case that the supplying and retaining properties to polishing liquid are not secured, the flatness of the object to be polished cannot be secured at a time of polishing work, especially at an initial polishing stage, which may increase an occurrence percentage of inferior products at the start of polishing work.

In order to solve these problems, a technology of a polishing pad using a polyurethane composition which contains a polyurethane resin copolymerized with a compound having a hydrophilic group and a hydrophilicizing agent is disclosed. (See JPA 2003-128910.) In this technology, an affinity of the polishing pad to polishing liquid is improved by enhancing hydrophilicity of the polishing pad to secure the supplying and retaining properties to polishing liquid. Accordingly, a polishing rate is enhanced and polishing performance is stabilized. Further, as a method for improving the hydrophilicity of a polishing pad, a method of making a hydrophilic material coexisted such as a method of jointly using a hydrophilic polyol ingredient such as polyethylene glycol (PEG) or the like, a method of adding a hydrophilic additive agent, or the like is mainly used.

On the other hand, a technology of a polishing pad using a polyurethane composition which does not include a hydrophilic high-molecular weight polyol having an ethylene oxide unit (—CH2CH2O—) and which has at least one hydrophilic group selected from the group of carboxyl group, sulfonic group, phosphate group, and salts thereof at a molecular side chain thereof is disclosed. (See JPA 2007-276061.)

SUMMARY OF THE INVENTION

The technology disclosed in JPA 2003-128910 improves a retaining property to polishing liquid. However, because the polyurethane material itself is hydrophilicized due to the hydrophilicizing agent or the like, a change in a shape due to swelling, lowering in wet heat resistance, lowering in chemical resistance or the like is brought fourth. For this reason, polishing performance is stabilized in an initial polishing stage, but deterioration of the polishing pad itself occurs with the passage of time. As a result of this, there is a drawback in that the surface shape (flatness) of the object to be polished is affected. Further, the technology disclosed in JPA 2007-276061 is hydrophilicized by using the polyurethane composition into which an ionic functional group is introduced. However, there is a drawback in swelling due to water absorption or in chemical resistance in the same manner as the technology disclosed in JPA 2003-128910.

In view of these circumstances, an object of the present invention is to provide a polishing pad capable of improving an affinity to polishing liquid and stabilizing polishing performance, a manufacturing method of the polishing pad and a polishing method using the polishing pad.

In order to achieve the object, a first aspect of the present invention is a polishing pad in which a large number of foams are formed by a dry molding method and which has a resin foamed body where opened pores of the foams are formed at a polishing surface for polishing an object to be polished, wherein communication holes are formed between the foams formed adjacently to each other at the resin foamed body, and wherein the communication holes are formed at a ratio of 800 holes/cm$^2$ or more per unit area when observed from a side of the polishing surface.

In the first aspect, since the communication holes are formed at a ratio of 800 holes/cm$^2$ or more per unit area when observed from a side of the polishing surface, polishing liquid supplied out of an exterior at a time of polishing work moves from the opened pores formed at the polishing surface through the foams which are communicated via the communication holes. Accordingly, the polishing pad of the first aspect can improve an affinity to polishing liquid and can stabilize polishing performance because cycling and retaining properties to polishing liquid are secured.

In this aspect, the communication holes may be formed at a ratio of 2000 holes/cm$^2$ or less per unit area when observed from the side of the polishing surface. Further, it is preferable that the resin foamed body is formed like a sheet having a thickness "a" in a range of from 0.5 mm to 1.5 mm, and a water absorption percentage expressed by a percentage of a change in a weight of the resin foamed body before and after the resin foamed body is dipped into water of 20 deg. C. to a weight of the resin foamed body before dipped is (31-16a) % or more when dipped for one hour and (56-24a) % or more when dipped for 24 hours. At this time, the resin foamed body may be formed so as to have an apparent density in a range of from 0.30 g/cm$^3$ to 0.80 g/cm$^3$, a Shore A hardness in a range of from 75 deg. to 95 deg. and an average pore diameter of the opened pores formed at the polishing surface in a range of from 90 μm to 130 μm. The resin foamed body may be formed by a polyurethane resin.

A second aspect of the present invention is to provide a manufacturing method of the polishing pad of the first aspect, comprising the steps of: a preparing step for preparing each ingredient of an isocyanate-group containing compound obtained by reacting a polyisocyanate compound and a polyol compound, a polyamine compound, water and a foam control agent; a foamed body forming step for forming a polyurethane foamed body by a dry molding method from mixed liquid in which the each ingredient prepared in the preparing step is mixed approximately uniformly; and a slicing step for slicing the polyurethane foamed body formed in the foamed body forming step into sheet-shaped pieces. In this case, the foam control agent prepared in the preparing step can be a silicone-based surfactant, and a mixed ratio of the silicone-based surfactant can be set in a range of from 0.15 weight parts to 0.65 weight parts to one weight part of the water. It is preferable that the mixed ratio of the silicone-based surfactant is set in a range of from 0.3 weight parts to 0.5 weight parts to one weight part of the water.

A third aspect of the present invention is to provide a polishing method of an object to be polished using the polishing pad of the first aspect, comprising the steps of: attaching the polishing pad to at least one of two plates disposed so as to face with each other at a polishing apparatus; and after setting the object to be polished between the plates, rotating at least one of the two plates while supplying polishing liquid in which abrasive grains are mixed between the object to be polished and the polishing pad. In this case, the object to be polished may be a silicon wafer.

According to the present invention, effects can be obtained that, since the communication holes are formed at a ratio of 800 holes/cm$^2$ or more per unit area when observed from a side of the polishing surface, polishing liquid supplied out of an exterior at a time of polishing work moves from the opened pores formed at the polishing surface through the foams which are communicated via the communication holes, and accordingly, the present invention can improve an affinity to polishing liquid and can stabilize polishing performance because cycling and retaining properties to polishing liquid are secured.

DETAILED DESCRIPTION OF THE PREFERRED EMBODIMENTS

An embodiment in which the present invention is applied to a polishing pad using for primary polishing work of a silicon wafer will be explained below with reference to the drawings.

(Configuration)

Figure 1:
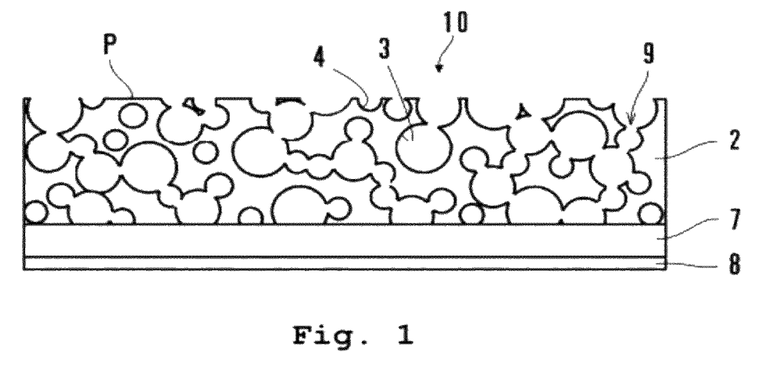
FIG. 1 is a sectional view illustratively showing a polishing pad of an embodiment according to the present invention.

As shown in FIG. 1, a polishing pad 10 of this embodiment is equipped with a urethane sheet 2 made of a polyurethane resin serving as a resin foamed body. The urethane sheet 2 has a polishing surface P for polishing an object to be polished. The urethane sheet 2 is formed by slicing and cutting a cured polyurethane foamed body which is obtained by pouring into a mold mixed solution where an isocyanate-group containing compound obtained by reacting a polyisocyanate compound and a polyol compound in advance, dispersion (dispersing liquid) in which water is dispersed and diluted in a polyol compound in advance and which includes a foam control agent, and a polyamine compound are mixed. That is, the urethane sheet 2 which constitutes the polishing pad 10 is formed by a dry molding method.

Foams (babbles) 3 having a circular or elliptic shape in section are formed so as to be dispersed approximately uniformly in an interior of the urethane sheet 2 due to the water in the dispersion at the time of dry molding. That is, the urethane sheet 2 has a foamed structure. An average pore diameter of the foams 3 can be adjusted by a content of the water which plays a role of a foaming agent and stir conditions at a manufacturing time or the like, and it is adjusted in a range of from 90 to 130 μm in this embodiment. Because the urethane sheet 2 is formed by slicing the polyurethane foamed body, a part of the foams 3 is opened at the polishing surface P to form opened pores 4. Because the opened pores 4 are formed by openings of the foams 3, an average pore diameter of the opened pores 4 is set in a range of from 90 to 130 μm. The foams 3 formed adjacently to each other in an interior of the urethane sheet 2 are communicated due to an action of the water in the dispersion and the foam control agent to form communication holes 9 between the communicated foams 3. A thickness "a" of the urethane sheet 2 can be adjusted at a time of slicing the polyurethane foamed body, and it is adjusted in a range of from 0.5 to 1.5 mm in this embodiment.

In the urethane sheet 2, an apparent density thereof is adjusted in a range of from 0.30 to 0.80 g/cm$^3$, and a Shore A hardness thereof is adjusted in a range of from 75 to 95 deg., respectively. Further, because the opened pores 4 are formed at the polishing surface P in the urethane sheet 2, the communication holes 9 formed between the foams 3 can be confirmed (observed) from a side of the polishing surface P. The communication holes 9 are formed at a ratio of 800 holes/cm$^2$ or more and 2000 holes/cm$^2$ or less per unit area when observed from the side of the polishing surface P. Incidentally, the communication holes 9 are observed as holes formed like pinholes having a diameter of 20 μm or less inside the opened pores 4.

Here, a role that the communication holes 9 play will be explained. In a polyurethane foamed body formed by a conventional dry molding method, polyurethane itself has hydrophobicity and has a foamed structure in which foams are formed independently. For this reason, the polyurethane foamed body is not affinitive to water (e.g., polishing liquid). By contrast, because the communication holes 9 are formed in the urethane sheet 2, water can move from the opened pores 4 of the polishing surface P via the communication holes 9 and the foams 3. As a formed ratio of the communication holes 9 increases more, the urethane sheet 2 is more affinitive to water, thereby a water absorption speed or a water absorption percentage is improved. This water absorption percentage is expressed by a percentage of a change in a weight of the urethane sheet 2 before and after the urethane sheet 2 is dipped into water to a weight of the urethane sheet 2 before the urethane sheet 2 is dipped. Goodness in the start of polishing work at an initial polishing stage is determined by an affinity to water, in other words, a water absorption speed. Further, in a case of polishing a plurality of objects to be polished continuously, as a polishing pad has a better affinity to water and a higher water retaining percentage, stability thereof is more superior. The urethane sheet 2 shows the water absorption percentage of (31−16a) % or more when it is dipped into water for one hour and the water absorption percentage of (56−24a) % or more when it is dipped into water for 24 hours. Here, "a" expresses the thickness (mm) of the urethane sheet 2. Because the water absorption percentage is affected by the thickness "a" of the urethane sheet 2, a preferable range was lead from a relationship between the thickness "a" in the above-stated range (0.5 to 1.5 mm) and the water absorption percentage. When the start of polishing work at an initial polishing stage and stability of polishing performance are taken into consideration, it is preferable that the water absorption percentage of (31−16a) % or more when dipped for one hour and the water absorption percentage of (56−24a) % or more when dipped for 24 hours. Thus, in order to enhance the water absorption percentage, it is preferable that an average pore diameter of the foams 3 is adjusted in a range of from 100 to 120 μm. The amount of water to be retained can be heightened up to an amount that entire aperture of the foams is filled with water. For example, in a case that the urethane sheet 2 has an apparent density of 0.4 g/cm$^3$, the water absorption percentage can be heightened up to 0.6 g/cm$^3$.

The apparent density of the urethane sheet 2 affects polishing properties largely. If the apparent density is less than 0.3 g/cm$^3$, durability becomes lowered because the urethane sheet 2 has aperture too much. To the contrary, if the apparent density exceeds 0.8 g/cm$^3$, polishing performance becomes lowered because the number of the foams 3 becomes little and wall portions of the polyurethane resin increase. When durability and polishing performance are taken into consideration, it is preferable that the apparent density is set in a range of from 0.40 to 0.60 g/cm$^3$. Further, a hardness of the urethane sheet 2 affects flatness of the object to be polished (work surface). If a Shore A hardness is less than 75 deg., the urethane sheet 2 becomes too soft, so that flatness of the work surface becomes lowered at polishing work. To the contrary, if the Shore A hardness exceeds 95 deg., it is not preferable because a scratch (polishing defect) occurs frequently. When an improvement in flatness at the work surface is taken into consideration, it is preferable that the Shore A hardness is set in a range of from 80 to 95 deg. With respect to the communication holes 9, it is not preferable if a formed ratio thereof is less than 800 holes/cm$^2$, because permeation of water becomes lowered, a water absorption speed becomes slow and a water absorption percentage also decreases. While, it is also not preferable if the formed ratio exceeds 2000 holes/cm$^2$, because physical properties such as hardness, density and the like change due to that slurry accumulates at a bottom surface (surface opposite to the polishing surface P) side of the polishing pad. When control on a change in physical properties is taken into consideration, it is preferable that the formed ratio of the communication holes 9 is set to 1000 holes/cm$^2$ or less.

The apparent density and the Shore A hardness also vary according to a composition, an average polymerization degree and molecular weight distribution of the polyurethane resin which constitutes the urethane sheet 2, or a shape or distribution of the opened pores, but they correlate largely with the foamed structure of the urethane sheet 2. The apparent density and the Shore A hardness can be adjusted by changing the size or the number of the foams 3, in other words, by changing the amount of the water in the dispersion.

Further, as shown in FIG. 1, a double-faced adhesive tape 7 for attaching the polishing pad 10 to a polishing machine adheres to an opposite side to the polishing surface P of the urethane sheet 2. The double-faced adhesive tape 7 is obtained by forming an adhesive layer (not shown) respectively on both faces of an unillustrated base member such as a film made of polyethylene telephthalate (hereinafter, abbreviated as PET) or the like. The double-faced adhesive tape 7 adheres to the urethane sheet 2 via an adhesive layer on one face side of the base member and an adhesive layer on the other face side (lowermost face side in FIG. 1) is covered with a release paper 8.

(Manufacture)

Figure 2:
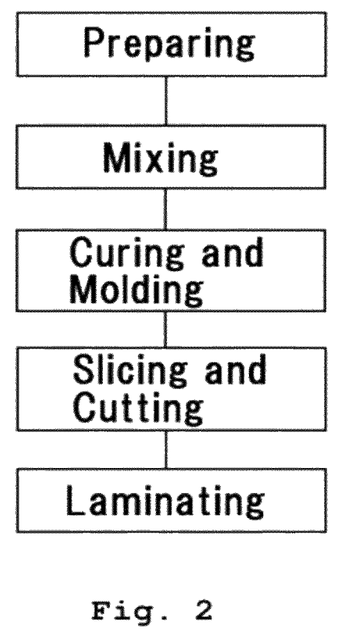
FIG. 2 is a process chart showing a gist of a manufacturing method of the polishing pad of the embodiment.

The polishing pad 10 is manufactured via each step shown in FIG. 2. Namely, the polishing pad is manufactured via a preparing step for preparing a polyisocyanate compound, a polyol compound, dispersion in which water and a foam control agent are dispersed and diluted in a polyol compound, a polyamine compound, respectively; a mixing step for forming an isocyanate-group containing compound by reacting the polyisocyanate compound and the polyol compound in advance and for mixing each ingredient of the obtained isocyanate-group containing compound, the dispersion and the polyamine compound to prepare mixed liquid; a curing and molding step for pouring the mixed liquid into a mold to make foams and cure the mixed liquid for forming a polyurethane foamed body; a slicing and cutting step for slicing and cutting the polyurethane foamed body into sheet-shaped pieces to form plural pieces of sheets; and a laminating step for adhering the urethane sheet 2 and the double-faced adhesive tape 7 to form the polishing pad 10. Each step will be explained below in the order of the steps.

(Preparing Step)

In the preparing step, the polyisocyanate compound, the polyol compound, the dispersion and the polyamine compound are prepared. The polyisocyanate compound to be prepared is not limited if it has two isocyanate groups or more in its molecule. For example, as a diisocyanate compound having two isocyanate groups in its molecule, m-phenylenediisocyanate, p-phenylenediisocyanate, 2,6-tolylenediisocyanate (2,6-TDI), 2,4-tolylenediisocyanate (2,4-TDI), naphthalene-1,4-diisocyanate, diphenylmethane-4,4'-diisocyanate, 3,3'-dimethoxy-4,4'-biphenyldiisocyanate, 3,3'-dimethyldiphenylmethane-4,4'-diisocyanate, xylylene-1,4-diisocyanate, 4,4'-diphenylpropanediisocyanate, trimethylenediisocyanate, hexamethylenediisocyanate, propylene-1,2-diisocyanate, butylenes-1,2-diisocyanate, cyclohexylene-1,2-diisocyanate, cyclohexylene-1,4-diisocyanate, p-phenylenediisothiocyanate, xylylene-1,4-diisothiocyanate, ethylidynediisothiocyanate or the like can be listed. Two kinds or more of these diisocyanate compounds may be used together, and a compound having three isocyanate groups or more in its molecule, for example, a triisocyanate compound having three isocyanate groups in its molecule may be used. When the Shore A hardness of the urethane sheet 2 is taken into consideration to be adjusted in the above stated range, it is preferable that tolylenediisocyanate such as 2,6-TDI, 2,4-TDI is included at least 50 weight percent.

On the other hand, as the polyol compound, a compound such as a diol compound, a triol compound or the like may be used. For example, both of a polyol compound having a low molecular weight such as ethylene glycol, butylene glycol or the like, and a polyol compound having a high molecular weight such as a polyether-polyol compound such as polytetramethyleneether-glycol (PTMG) or the like, a polyester-polyol compound such as a reactant of ethylene glycol and adipic acid, a reactant of butylene glycol and adipic acid or the like, a polycarbonate-polyol compound, a polycaprolactone-polyol compound or the like can be used. Further, two kinds or more of these polyol compounds may be used together.

Further, the polyol compound used for preparing the dispersion can restrain not only elusion to be occurred at polishing work but also a bad influence against polishing performance by reacting with an isocyanate group of the isocyanate-group containing compound. In the dispersion, because the water and the foam control agent are dispersed in the polyol compound which is not concerned with foaming, the dispersion plays the role of lowering mixing unevenness of the water and the foam control agent in the next mixing step. As the polyol compound, a compound such as a diol compound, a triol compound or the like may be used. For example, both of a polyol compound having a low molecular weight such as ethylene glycol, butylene glycol or the like, and a polyol compound having a high molecular weight such as PTMG, polyethylene glycol (PEG), polypropylene glycol (PPG) or the like can be used. By adjusting viscosity of the dispersion to the same degree as that of the solution of the isocyanate-group containing compound or the polyamine compound, the water is apt to disperse evenly in the mixing step. Accordingly, it is preferable to use a polyol compound having a number average molecular weight of 500 to 3000. In this embodiment, PTMG having a number average molecular weight of 1000 is used. When the dispersion is prepared, an ordinary stirring apparatus may be used for stirring and mixing, so that the water and the foam control agent are dispersed and diluted approximately uniformly.

The water to be dispersed in the dispersion is not limited especially, but it is preferable to use distilled water in order to avoid mixing of impurities and the like. A mixed ratio of the water to the dispersion is adjusted in a range of from 3.00 to 3.75 weight percent.

While, the foam control agent to be dispersed in the dispersion plays the role of adjusting a ratio of the communication holes 9 formed at the polyurethane foamed body to be obtained. Namely, because a foam control agent varies in dispersion force, compatibility to a polyol compound and stability force in foaming depending on its kind, the formed ratio of the communication holes 9 can be adjusted by controlling a kind and an addition (amount) of the foam control agent. As a preferable foam control agent for forming the communication holes 9, a silicone-based surfactant may be listed, and especially, it is preferable to use a silicone-based surfactant which does not have an active hydrogen group. As a silicone-based nonionic surfactant, for example, polyether denatured silicone, namely, polyoxyalkylene-dimethylpolysiloxane-copolymer can be listed. As polyether which constitutes the polyether denatured silicone, polyethylene oxide, polypropylene oxide, copolymer of these or the like may be exemplified. As a foam control agent of such a silicone-based nonionic surfactant, concretely, a silicone foam control agent SH-190, SH-192, SH-193 (manufactured by Dow Corning Toray Silicone Company Ltd.), L-5340 (manufactured by Nippon Unicar Company Limited) or the like may be exemplified.

The addition of the foam control agent to the dispersion is adjusted by an addition of the water mixed as a foaming agent. It is preferable that the above-stated foam control agent SH-193 is adjusted in a range of from 0.15 to 0.65 weight parts to one weight part of the water. If the addition of the foam control agent to the water is less than 0.15 weight parts, dispersibility of the dispersion to the polyurethane resin deteriorates and unevenness in a shape or distribution of the foams occurs, thereby the polyurethane foamed body having the above-stated foamed structure can not be obtained. To the contrary, if the addition exceeds 0.65 weight parts, the number of the communication holes 9 formed at the polyurethane foamed body decreases, and a result of it, an affinity to water deteriorates. Because the foamed structure correlates with physical properties such as an apparent density and a Shore A hardness, in order to secure the physical properties and the affinity to water in a good balance, it is preferable that the foam control agent is mixed in a range of from 0.3 to 0.5 weight parts to one weight part of the water.

The polyamine compound prepared in the preparing step reacts with the isocyanate group of the isocyanate-group containing compound. As the polyamine compound, an aliphatic or aromatic polyamine compound can be used. For example, ethylenediamine, propylenediamine, hexamethylenediamine, isophoronediamine, dicyclohexylmethane-4,4'-diamine, 3,3'-dichloro-4,4'-diaminodiphenylmethane (hereinafter abbreviated as MOCA), a polyamine compound having a structure similar to MOCA and the like may be listed. Further, the polyamine compound may have a hydroxyl group. As such a amine-based compound, for example, 2-hydroxyethylethylenediamine, 2-hydroxyethylpropylenediamine, di-2-hydroxyethylethylenediamine, di-2-hydroxyethylpropylenediamine, 2-hydroxypropylethylenediamine, di-2-hydroxypropylethylenediamine and the like may be listed. Two kinds or more of these compounds may be used together. As a polyamine compound, in this embodiment, MOCA is used in a melted state by heating it to about 120 deg. C.

(Mixing Step, Curing and Molding Step)

As shown in FIG. 2, in the mixing step, the isocyanate-group containing compound, namely, isocyanate terminal urethane prepolymer (hereinafter simply abbreviated as prepolymer) is formed by reacting the polyisocyanate compound and the polyol compound both prepared in the preparing step. The obtained prepolymer, and the dispersion and the polyamine compound prepared in the preparing step are mixed to prepare mixed liquid. In the curing and molding step, the mixed liquid prepared in the mixing step is poured into a mold for foaming and curing the mixed liquid inside the mold to obtain the polyurethane foamed body. In this embodiment, the mixing step, and the curing and molding step are carried out continuously.

When the prepolymer is formed, a mol amount of the isocyanate group of the polyisocyanate compound is set to be larger than a mol amount of the hydroxyl group of the polyol compound. Further, if viscosity of the prepolymer to be used is too high, liquidity deteriorates so that it is difficult to mix approximately uniformly at a time of mixing. If a temperature is raised to lower the viscosity, a pot life thereof is shortened and unevenness of mixture is brought forth on the contrary, so that a size of the foams 3 formed at the polyurethane foamed body to be obtained varies. While, if the viscosity is too low, foams move in the mixing liquid so that it is difficult to form the foams 3 which are dispersed approximately uniformly in the polyurethane foamed body. For these reasons, it is preferable to set the viscosity at a temperature of 30 to 80 deg. C. of the prepolymer in a range of from 2000 to 20000 mPa·s. For example, the viscosity can be set according to changing a molecular weight (degree of polymerization) of the prepolymer. The prepolymer is heated to about 30 to 80 deg. C. to be in a state capable of flowing.

Figure 3:
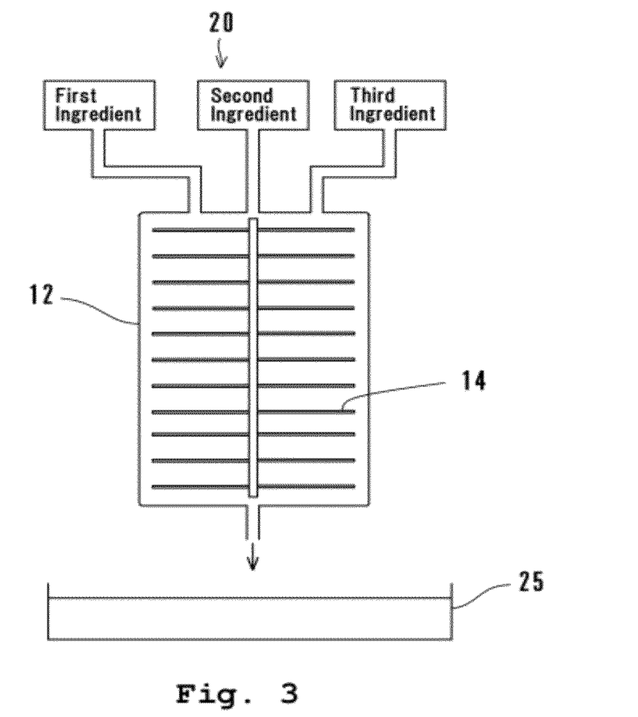
FIG. 3 is a block chart showing an outline of a mixer and a mold used for manufacturing the polishing pad of the embodiment.

As shown in FIG. 3, the mixed liquid is prepared by a mixer 20 in the mixing step, the prepared mixed liquid is poured into a mold 25 continuously from the mixer 20 for curing to mold the polyurethane foamed body in the curing and molding step. The mixer 20 is equipped with a mixing tank 12 in which mixing blades 14 are build. Supplying tanks, respectively accommodating the prepolymer as a first ingredient, the polyamine compound as a second ingredient and the dispersion as a third ingredient, are disposed at an upstream side of the mixing tank 12. Because most of the prepolymer of the first ingredient and the polyamine compound represented by MOCA of the second ingredient are solid or in a state hard to flow at a normal temperature, respective of the supplying tanks are heated so as each ingredient to be in a state capable of flowing. A supplying outlet led out of respective of the supplying tanks is connected to an upstream end of the mixing tank 12. The mixing blades 14 are fixed to a rotation shaft disposed approximately at a central portion from an upstream side to a downstream side inside the mixing tank 12. A size of the mold 25 is set to 1050 mm (length)×1050 mm (width)×50 mm (thickness) in this embodiment.

The first ingredient, second ingredient, third ingredient are supplied from respective of the supplying tanks to the mixing tank 12 to mix them so as to be in an uniform state by the mixing blades 14. The mixing blades 14 rotate as the rotation shaft of the mixer 20 rotates to mix each of the ingredients so as the mixing blades 14 to shear them. At this time, by adjusting the shearing speed and the shearing number of the mixing blades 14, each of the ingredients are mixed approximately uniformly to prepare the mixed liquid. If the shearing speed of the mixing blades 14 is too small, a size of the foams 3 formed at an obtained polyurethane foamed body becomes too large. To the contrary, if the shearing speed is too large, the viscosity lowers because a temperature is raised by heat generation due to friction between the mixing blades 14 and the mixed liquid. Accordingly, foams formed in the mixed liquid move (during a period of molding), which is liable to unevenness in a dispersion state of the foams 3 formed at an obtained polyurethane foamed body. While, if the shearing number is too few, a size of the foams to be formed is apt to vary, to the contrary if the shearing number is too many, the foams 3 are not formed approximately uniformly because the viscosity lowers due to temperature rise. For these reasons, in the mixing step, the shearing speed is set in a range of from 9,000 to 41,000/sec and the shearing number is set in a range of from 300 to 10,000 turns to mix the mixed liquid. A mixing time (retention time) at the mixer 20 depends on a flow volume (maximum 1 litter/sec) of the mixed liquid, but it is about 1 sec or so. Namely, it takes about 1 to 2 minutes or so to pour the mixed liquid of 100 kg or so into the mold 25. Incidentally, the shearing speed and the shearing number can be calculated by the following formulas. Namely, Shearing speed (/sec)=Diameter (mm) of blade tip of mixing blades 14×Pi (π)×Revolution speed (rpm) of mixing blades 14÷60÷Clearance (mm) between blade tip of mixing blades 14 and inner wall of mixing tank 12; and Shearing number (turns)=Revolution speed (rpm) of mixing blades 14÷60× Retention time (sec) of mixed liquid in mixing tank 12× Number of blades of mixing blades 14.

In the curing and molding step, the obtained mixed liquid is poured from a discharge outlet disposed at a downstream end of the mixing tank 12 into the mold 25. When the mixed liquid is poured into the mold 25, the mixed liquid out of the mixer 20 is discharged from the discharge outlet of the mixing tank 12, and for example, via a flexible pipe, the mixed liquid is led to an unillustrated pouring port having a triangle shape in section which reciprocates between opposite two sides (e.g., between right and left in FIG. 3) of the mold 25. The end of the discharge outlet (end of the flexible pipe) is caused to reciprocate in a direction orthogonal to a moving direction of the pouring port. The mixed liquid is poured into the mold 25 approximately uniformly. The poured mixed liquid is reacted and cured in the mold 25 to form a block-shaped polyurethane foamed body. At this time, the prepolymer is crosslinked and cured by reaction of the prepolymer, and the polyol compound and the polyamine compound. Simultaneously with a progress of this crosslinking and curing, a carbon dioxide is formed due to reaction between the isocyanate group of the prepolymer and the water dispersed and diluted in the dispersion. Because the crosslinking and curing is in a progress, the formed carbon dioxide does not run away to an exterior and the foams 3 are formed.

Polydimethylsiloxane which is a main structure of the silicone-based surfactant used for the foam control agent shows relatively low surface tension. A role of the foam control agent in polyurethane foaming is based upon a property of this polydimethylsiloxane. The silicone-based surfactant exhibits superior surface activity effects to a non-silicone-based surfactant in polyurethane foaming. Contribution of the foam control agent to polyurethane foaming is classified largely into assistance to stirring force in a low viscosity range and stabilization of foams in a high viscosity range where reaction has been progressed. The assistance to stirring force means to mix and emulsify material ingredients and to disperse involved gas. While, the stabilization of foams means to control the unification of foams and to stabilize membrane. Effects can be obtained by adjusting surface tension in controlling the unification of foams, and by adjusting dynamic surface tension, surface elasticity and surface viscosity in stabilizing membrane. Accordingly, by selecting conditions that effects of the assistance to stirring force become large and the stabilization of the formed foams becomes small, a formed ratio of the communication holes 9 can be increased. The conditions are selected depending on the addition of the water mixed as a foaming agent, a kind and an addition of the foam control agent.

(Slicing and Cutting Step)

As shown in FIG. 2, in the slicing and cutting step, the polyurethane foamed body obtained in the curing and molding step is sliced into sheet-shaped pieces, and the pieces are cut to a desirable shape such as a circle and a desirable size to form plural pieces of sheets. A general slicer can be used for slicing. When slicing is performed, the polyurethane foamed body is sliced in the order from an upper layer portion with a predetermined thickness, while a lower layer portion thereof is supported. The thickness for slicing is set in a range of from 0.5 mm to 1.5 mm in this embodiment. In the polyurethane foamed body molded within the mold 25 having a thickness of 50 mm which is used in this embodiment, for example, about 10 mm of each of the upper layer portion and the lower layer portion is not used for the reason of a defect or the like, and about 30 mm of a central portion is sliced into from 20 to 60 pieces of sheets. When cutting is performed, punching with a pattern having a desirable shape or cutting with a cutter may be employed. Because the polyurethane foamed body in which the foams 3 are formed approximately uniformly can be obtained in the curing and molding step, in each of the plural pieces of sheets formed in the slicing and cutting step, an average pore diameter of the opened pores 4 formed at a surface thereof is in a range of from 90 to 130 μm. If the average pore diameter of the opened pores 4 is less than 90 μm, a life of the polishing pad is apt to be shortened because abrasive grains or the like in polishing liquid is easy to clog at a time of polishing work. To the contrast, if it exceeds 130 μm, it is difficult to control having an approximately uniform pore diameter.

(Laminating Step)

In the laminating step, the double-faced adhesive tape 7 is caused to adhere with an adhesive layer on one face side to a face opposite to the polishing surface P of the urethane sheet 2. Then, inspection such as confirming that neither dirt nor a foreign matter adheres to the urethane sheet 2 or the like is carried out to complete the polishing pad 10.

(Polishing Work)

When polishing work is carried out to an object to be polished, a single surface polishing machine for polishing a single surface of the object to be polished or a double surface polishing machine for polishing both surfaces of the object to be polished can be used. When the single surface polishing machine is used, the polishing pad 10 is attached to the polishing plate. When the polishing pad 10 is attached to the polishing plate, the release paper 8 is peeled off and the polishing pad 10 is caused to adhere and fix to the polishing plate with the exposed adhesive layer. While pressing the object to be polished held by a holding plate which is disposed so as to face the polishing plate to a side of the polishing surface P and supplying slurry (polishing liquid including abrasive grains) from an exterior, by rotating the polishing plate and/or the holding plate, polishing work is performed to a work surface of the object to be polished. On the other hand, when the double surface polishing machine is used, the polishing pad 10 is respectively attached to two plates disposed to face with each other. After disposing the object to be polished between the plates, by rotating at least one of the plates while supplying slurry, polishing work is performed to the object to be polished. When polishing work is performed, slurry is supplied to the entire work surface approximately uniformly because slurry moves via the foams 3 and the communication holes 9 while it is retained by the opened pores 4. Incidentally, water is used as a medium of polishing liquid usually, but organic solvent such as alcohol or the like may be mixed together. Further, polishing work due to a chemical function by adding acid, alkali or the like may be employed.

(Functions and the Like)

Next, with respect to functions and the like of the polishing pad 10 in this embodiment, functions of the urethane sheet 2 having the foamed structure in which the foams 3 are communicated by the communication holes 9 will be explained mainly.

Conventionally in polishing work, a polishing pad that has an independent foamed structure formed by a dry molding method and that opened pores are formed at a polishing surface is used. At a time of polishing work, polishing liquid is supplied between the object to be polished and the polishing pad, and this polishing liquid is supplied to a work surface of the object to be polished while it is retained at the opened pores formed at the polishing surface. However, because a polyurethane resin has hydrophobicity, the supplying and retaining properties to polishing liquid may become insufficient. Further, the opened pores may clog with the abrasive grains or the polishing dust occurred according to polishing work. In a case that the supplying and retaining properties to slurry is insufficient, a polishing rate lowers and it is difficult to polish the surface of the object to be polished uniformly, so that the surface quality of the object to be polished deteriorates. In an initial stage of polishing work, the polyurethane resin is not affinitive to polishing liquid because it has hydrophobicity, so that the start of polishing work becomes late. Furthermore, because clogging of the opened pores is also accelerated, not only flatness of the object to be polished deteriorates due to that a polishing defect (scratch) occurs at the work surface but also a life of the polishing pad is shortened. When clogging of the opened pores occurs, polishing work is suspended in order to perform dressing work to the polishing surface. In dressing work, because a new surface is exposed by removing a surface at which clogging has occurred, it is possible to recover polishing performance. However, not only efficiency lowers due to suspension of polishing work, but also a stable polishing work is not secured due to a change in a polishing rate before and after the dressing work. There is a technology for giving hydrophilicity to a polishing pad itself by deciding materials for the polyurethane resin and by introducing a hydrophilic group to the polyurethane resin, but the technology needs to employ a particular polyol compound and a particular hydrophilic group. Besides, because the polishing pad itself swells due to slurry with the passage of time by introducing the hydrophilic group, flatness of the object to be polished and stabilization of polishing performance become insufficient. The polishing pad of this embodiment can solve these problems.

In order to improve an affinity between a polishing pad (urethane sheet made by a dry molding method) and slurry, Inventors made an eager study on the improvement and found that water absorptivity can be improved by optimizing the foamed structure without changing the urethane material by introducing the hydrophilic group or by adding the hydrophilic additive agent or the like. Namely, Inventors found that the supplying and retaining properties to slurry can be improved by forming the communication holes between the foams which are originally formed independently according to a dry molding method, by adjusting a kind of the foam control agent and a mixed ratio of the foam control agent to the water which is mixed to adjust the apparent density, foam diameter and foam shape of the urethane sheet.

In this embodiment, the foams 3 formed at the urethane sheet 2 which constitutes the polishing pad 10 are communicated by the communication holes 9. For this reason, the polishing liquid supplied to the side of the polishing surface P moves from the opened pores 4 that the foams 3 are opened via the communication holes 9 and the foams 3. Namely, supplying and retaining of the polishing liquid can be realized due to not only foams 3 opened at the polishing surface P but also foams 3 communicated with the foams 3 opened at the polishing surface P, and accordingly the supplying and retaining properties are improved remarkably in comparison with the conventional polishing pad. Thus, the polishing pad can improve the supplying and retaining properties to polishing liquid from an initial stage of polishing work, and can improve the start of polishing work largely. Further, clogging of the opened pores 4 is restrained since the polishing surface P is reproduced appropriately because it is worn away at a time of polishing work. For this reason, polishing liquid is supplied to the entire work surface while it is retained by the polishing pad, and accordingly stabilization of polishing performance is realized.

Further, in this embodiment, the apparent density of the urethane sheet 2 is adjusted in a range of from 0.3 to 0.8 g/cm$^3$. The apparent density depends on a charge of a material, a foam diameter or the like, but a foam diameter is apt to become small if the apparent density is too high. It is possible to densify the urethane sheet 2 without changing the foam diameter due to setting of conditions, but in this case, wall portions of the polyurethane resin become too thick, and lowering in a polishing rate or an increase in scratches may be bought forth. To the contrary, if the apparent density is too low, it is not preferable because it causes a bad influence due to strength degradation and deterioration in flatness at a time of polishing work. Accordingly, the lowering in a polishing rate and the deterioration in flatness at a time of polishing work can be restrained by adjusting the apparent density in the above-stated range.

Furthermore, in this embodiment, the urethane sheet 2 has the foamed structure that the foams 3 are communicated by the communication holes 9 and the communication holes 9 are formed at the ratio of 800 holes or more and 2000 holes or less in an area of 1 cm$^2$ when observed from the side of the polishing surface P. Because polishing liquid or water can penetrate via the communication holes 9, the affinity of the polishing pad 10 to water is improved so that the water absorptivity is enhanced. If the formed ratio of the communication holes 9 is less than 800 holes/cm$^2$, the water absorptivity becomes insufficient and it is difficult to improve the affinity to water. To the contrary, if the formed ratio exceeds 2000 holes/cm$^2$, it is not preferable because slurry accumulates at the bottom side of the polishing pad and a physical property such as hardness, density or the like changes with the passage of time. Because the communication holes 9 are formed at the urethane sheet 2, the urethane sheet 2 shows such a water absorption percentage as, when a thickness of the urethane sheet 2 is "a" (mm), (31-16a) % or more when it is dipped in water for one hour and (56-24a) % or more when it is dipped in water for 24 hours. Accordingly, because the water absorptivity is improved, the urethane sheet 2 can secure the cycling and retaining properties to polishing liquid and can improve polishing performance.

Moreover, in this embodiment, by setting an amount of the foam control agent in the dispersion to from 0.15 to 0.65 weight parts to one weight part of the water in the dispersion, the foams 3 in which the communication holes 9 having a diameter of 20 μm or less are formed at a ratio of 800 holes/cm$^2$ or more and 2000 holes/cm$^2$ or less can be formed, while the foams are distributed approximately uniformly in the polyurethane resin. In other words, by setting the amount of the foam control agent to the water in the above-stated range, the water absorptivity can be improved without changing the physical property of the polishing pad, so that, for example, a polishing pad having a high hardness and water absorptivity can be obtained. Thus, the obtained plural pieces of the urethane sheets 2 can retain polishing liquid at the opened pores 4 and polishing dust is accommodated in the opened pores 4 at a time of polishing work, thereby they can improve polishing performance.

Incidentally, a concrete compound was not exemplified especially in this embodiment, but a triisocyanate compound may be mixed to the polyisocyanate compound used for preparing the prepolymer. By mixing the triisocyanate compound, the polyurethane foamed body becomes hardened, thereby tenacity can be lowered and a dressing property can be improved. In this case, it is preferable to set a ratio of the triisocyanate compound to be mixed to about from 0.3 to 0.8 in a weight ratio. Further, it is preferable that the polyisocyanate compound includes tolylenediisocyanate and a mixed ratio thereof is at least 50 weight percent. Furthermore, PTMG was exemplified as the polyol compound used for preparing the prepolymer, a polyol compound other than PTMG may be mixed. In this case, it is preferable that the mixed ratio of PTMG is at least 50 weight percent.

Further, in this embodiment, as the prepolymer, isocyanate terminal urethane prepolymer obtained by reacting the polyol compound and the diisocyanate compound was exemplified, but the present invention is not limited to this. For example, an active hydrogen compound having a hydroxyl group, an amino group or the like may be used instead of the polyol compound, and a polyisocyanate compound or a derivative thereof may be used instead of the diisocyanate compound, and the prepolymer can be obtained by reacting these. Further, because there are many kinds of isocyanate terminal urethane prepolymer on the market, such one on the market may be used. Further, in this embodiment, an example that the dispersion was prepared by dispersing and diluting the water and the foam control agent to the polyol compound was shown, however, the present invention is not limited to this. The dispersion may include, for example, an ingredient such as an additive agent, a filler or the like which is necessary for curing and molding, other than the polyol compound, the water and the foam control agent. In the dispersion, because the water and the foam control agent are dispersed in the polyol compound which is not concerned with foaming, the dispersion plays the role of lowering mixing unevenness of the water and the foam control agent in the mixing step. It is possible to use liquid other than the polyol compound, but there is a possibility that such liquid may solve out at polishing work and give a bad influence to polishing performance. When such a matter is taken into consideration, it is preferable to use the polyol compound.

Further, in this embodiment, an example that the apparent density is adjusted in a range of from 0.30 to 0.80 g/cm$^3$ and the Shore A hardness is adjusted in a range of from 75 to 95 deg. was shown, but the present invention is not limited to these. These ranges are preferable because the polishing pad 10 is used for primary polishing work of a silicon wafer, but the ranges may be changed appropriately by a property of an object to be polished in polishing work, required polishing accuracy or the like.

Furthermore, recessing (grooving) or embossing may be performed to the side of the polishing surface P for supplying polishing liquid and discharging polishing dust, although such a matter was not referred to in this embodiment especially. A radial shape, a lattice-like shape, a spiral shape or the like may be employed for a shape of the groove(s), and a rectangular shape, a U shape, a V shape, a semicircular shape or the like may be employed for a cross section shape thereof. A pitch, a width and a depth are not limited especially if the grooves allow discharging of polishing dust or moving of polishing liquid. It goes without saying that embossing is not limited especially, too.

Furthermore, the urethane sheet 2 may have, at least at a part thereof, an optical transmission portion which allows optical transmission for detecting a state of polishing work to an object to be polished. In this case, it is preferable that the optical transmission portion is formed so as to penetrate an entire thickness direction of the urethane sheet 2. In such a configuration, for example, by a light emitting element such as a light emitting diode or the like and a light receiving element such as a phototransistor or the like equipped with a side of a polishing machine, the state of polishing work at the work surface of the object to be polished can be detected during polishing work via the optical transmission portion. Thereby the end of polishing work can be detected appropriately, and accordingly polishing performance can be improved.

Further, in this embodiment, the mixer 20 in the mixing step and the slicer in the slicing step were shown. The mixer or the slicer is not limited especially and a generally used mixer or slicer may be used. Further, in this embodiment, the mold 25 having a rectangular shape was shown, but the present invention is not limited by a shape or size of a mold. For example, a mold having a cylindrical shape or the like may be used, and when viscosity of the mixed liquid is taken into consideration, a foamed body may be formed without using a mold.

EXAMPLES

Examples of the polishing pad 10 manufactured according to this embodiment will be explained below. Incidentally, Controls (Comparative Examples) manufactured for comparison will also be explained.

Example 1

In Example 1, prepolymer of the first ingredient obtained by reacting 2,4-TDI, PTMG having a number average molecular weight of about 1000 and diethylene glycol was heated to 55 deg. C. and degassed under a reduced pressure. This prepolymer had an isocyanate containing amount of 9.6%. MOCA of the second ingredient was melted at 120 deg. C. and degassed under a reduced pressure. The dispersion of the third ingredient was obtained by mixing PTMG having a number average molecular weight of about 1000, water, catalyst (TOYOCAT-ET manufactured by Tosoh Corporation) and silicone-based surfactant (SH-193 manufactured by Dow Corning Toray Silicone Company Ltd.) at a ratio of 2.5/0.1/0.05/0.05. In this dispersion, a mixed ratio of the silicone-based surfactant falls upon 0.5 weight parts when converted to per one weight part of the water. After the first, second and third ingredients were degassed under a reduced pressure, they were supplied to the mixing tank 12 at a ratio of 79.0/18.3/2.7. After the obtained mixed liquid was poured into the mold 25 and was cured, a formed polyurethane foamed body was taken out of the mold 25. This foamed body was sliced to sheet-shaped pieces each having a thickness of 1.3 mm, and each of the pieces were cut to a circular shape having a diameter of 800 mm to obtain the urethane sheets 2. Thus, a polishing pad A of Example 1 was manufactured using this urethane sheet.

Example 2

In Example 2, a polishing pad B of Example 2 was manufactured using the urethane sheet 2 in the same manner as Example 1 except that an addition ratio of the silicone-based surfactant was set to 0.03. At this time, a mixed ratio of the silicone-based surfactant falls upon 0.3 weight parts when converted to per one weight part of the water.

(Control 1)

In Control 1, a polishing pad C of Control 1 was manufactured using the urethane sheet in the same manner as Example 1 except that an addition ratio of the silicone-based surfactant was set to 0.15. At this time, a mixed ratio of the silicone-based surfactant falls upon 1.5 weight parts when converted to per one weight part of the water.

(Control 2)

In Control 2, a polishing pad D of Control 2 was manufactured using the urethane sheet in the same manner as Example 1 except that an addition ratio of the silicone-based surfactant was set to 0.01. At this time, a mixed ratio of the silicone-based surfactant falls upon 0.1 weight parts when converted to per one weight part of the water.

(Evaluation 1)

With respect to the urethane sheet which constitutes the polishing pad of each of Examples and Controls, an apparent density, a Shore A hardness, an average pore diameter of the foams 3, the number of the communication holes 9 and a water absorption percentage (one hour later, 24 hours later) were measured. In the measurement of the apparent density, a test piece (10 cm×10 cm) was cut from the urethane sheet to measure a weight WO with an electronic balance (Type: Mettler-AJ-180) and a thickness t with a dial gauge. The apparent density was calculated from the thickness t and the weight WO in accordance with Apparent Density ($\rho$)=WO/t/10. In the measurement of the Shore A hardness, plural test pieces cut in the same manner as the measurement of the apparent density were stacked so that a thickness thereof is 4.5 mm or more, and the Shore A hardness was measured by an A-type hardness meter (Japanese Industrial Standards JIS K 7311). For example, in a case that a thickness of one test piece is 1.3 mm, four test pieces were stacked to measure the hardness. In the measurement of the average pore diameter of the foams 3, a section of the urethane sheet was observed with a scanning electron microscope (SEM) to measure diameters of the foams 3 and then an average diameter thereof was calculated. In the measurement of the number of the communication holes 9, a SEM image having a visual field of 5 mm$^2$ was taken by magnifying a surface of the test piece 50 times with a SEM to count the number of the communication holes 9 which are viewed inside the foams 3 in the SEM image. With respect to 10 portions of the test piece, the number of the communication holes 9 counted from the SEM image was summed up to calculate the number converted to per 1 cm$^2$. In the measurement of the water absorption percentage (%), a weight of a test piece cut to 3 cm×10 cm was measured in advance, and it was dipped into water of 20 deg. C. The test piece was raised with a pair of tweezers after one hour and 24 hours, and the weight was measured 5 sec. after the test piece was raised. Based upon the weight before and after dipping, the water absorption percentage was calculated according to Water absorption percentage (%)=(Weight after dipping−Weight before dipping)/Weight before dipping×100. The measurement results of the apparent density, the Shore A hardness, the average diameter of the foams 3, the number of the communication holes 9 and the water absorption percentage are shown in Table 1 below. Incidentally, in Table 1, "Density" expresses the apparent density, "Foam Dia." expresses the average pore diameter of the foams 3, and "Communication Holes" express the number of the communication holes 9, respectively.

TABLE 1

|  |  | Density (g/cm³) | Foam Dia. (μm) | Shore A Hardness (deg.) | Communication Holes (holes/cm²) | Water Absorption Percentage (%) After 1 h | Water Absorption Percentage (%) After 24 hs |
|---|---|---|---|---|---|---|---|
| Example 1 | Polishing Pad A | 0.53 | 125 | 85 | 850 | 15.6 | 32.3 |
| Example 2 | Polishing Pad B | 0.49 | 116 | 84 | 905 | 18.5 | 38.2 |
| Control 1 | Polishing Pad C | 0.52 | 110 | 85 | 783 | 9.3 | 24.3 |
| Control 2 | Polishing Pad D | 0.51 | 115 | 86 | 620 | 7.5 | 28.3 |

Figure 4:
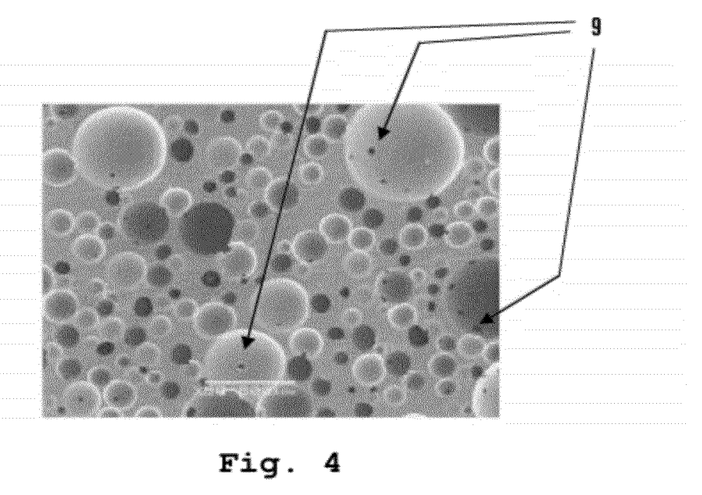
FIG. 4 is a microphotograph showing a forming state of communication holes at a polishing surface of a polishing pad according to Example 1.

As shown in Table 1, it was understood that the communication holes were formed by adding the silicone-based surfactant at the time of forming the urethane sheet in each of Examples and Controls. As shown in FIG. 4, it was found that the communication holes 9 were formed at the foams 3 having an approximately spherical shape. In each of the urethane sheets of Examples and Controls, the apparent density was ranged of from 0.30 to 0.80 g/cm³, the Shore A hardness was ranged of from 75 to 95 deg. and the average pore diameter of the foams 3 was ranged of from 90 to 130 μm. However, the number of the communication holes 9 varied largely according to the addition ratio of the foam control agent. Namely, the number was shown 800 holes/cm² or less in each of the urethane sheet of Control 1 that the addition ratio was set large and the urethane sheet of Control 2 that the addition ratio was set small. While, the urethane sheets of Examples 1 and 2 that the addition ratio of the foam control agent to a water ratio of 0.1 was adjusted to 0.05, 0.03, respectively which fall within a range of from 0.015 to 0.065 showed 850 holes/cm² and 905 holes/cm², respectively which exceed 800 holes/cm². It was made clear from this that the formed ratio of the communication holes 9 can be enhanced by setting the addition ratio of the foam control agent of the silicone-based surfactant in a range of from 0.3 to 0.5 weight parts to one weight part of the water. Incidentally, it was confirmed that the formed ratio of the communication holes 9 can be adjusted in a range of from 800 to 2000 holes/cm² by setting the mixed ratio of the silicone-based surfactant to from 0.15 to 0.65 weight parts to one weight part of the water.

(Evaluation 2)

Further, with respect to each of the polishing pads of Examples and Controls, polishing performance was evaluated by polishing work to a silicon wafer under the following polishing conditions. Namely, after attaching the polishing pad respectively to upper and lower polishing plates of a polishing apparatus, polishing work was performed to each 100 pieces of a silicon wafer having each standard to measure flatness thereof. In the measurement of flatness, a flatness measurement apparatus (Nanometoro300TT-A manufactured by Kuroda Precision Industries Ltd.) was used by setting "Edge Exclusion" to 2 mm, "Cell size of Site-Flatness" to 26 mm×8 mm, "Cell Layout" to 0 mm×0 mm. GBIR/SFQR (max)/SBIR (max) defined by SEMI Standard were used as flatness parameters. GBIR (global back surface-referenced ideal plane/range) means a range of plus and minus deviations at an entire (global) front surface of a semiconductor wafer from an ideal plane which is referenced by a back surface of the semiconductor wafer, and it is used for evaluation of flatness with respect to an entire wafer surface defined other than a peripheral portion thereof. SFQR (site front surface referenced least squares/range) means a range of plus and minus deviations from a front surface of a semiconductor wafer defined by a least-square error with respect to a surface at a predetermined size, and a value of SFQR (max) expresses a maximum value of SFQR in an entire part area on a predetermined wafer. SBIR (site back surface-referenced ideal plane/range) means a deviation of a thickness of a part of a semiconductor wafer which is referenced by a back surface corresponding to a deviation of an entire thickness of a part area, and SBIR (max) expresses a maximum value of SBIR. SFQR and SBIR relate to flatness at some limited area of a wafer, and they are used for evaluation of flatness corresponding approximately to an area at which semiconductor parts are manufactured. To a reference in flatness of a silicon wafer polished by the polishing pad C (Control 1) that the addition ratio of the foam control agent is set to 0.15, a changing ratio of flatness of respective of silicon wafers polished by respective of the polishing pads was obtained by a percentage. With respect to each flatness parameter, the results of the changing ratios to the reference are shown in Table 2 below.

(Polishing Conditions)
  Polishing Wafer: diameter 300 mmφ, silicon wafer
  Polishing Apparatus: double surface polishing apparatus manufactured by Fujikoshi Machinery Corp.
  Polishing Liquid: colloidal silica type manufactured by Fujimi Incorporated
  Polishing Pressure: 150 g/cm²
  Carrier: metal made

TABLE 2

|  |  | GBIR | SFQR (max) | SBIR (max) |
|---|---|---|---|---|
| Example 1 | Polishing Pad A | −31% | −14% | −54% |
| Example 2 | Polishing Pad B | −32% | −8% | −50% |
| Control 1 | Polishing Pad C | 0% | 0% | 0% |
| Control 2 | Polishing Pad D | −17% | 6% | −52% |

As shown in Table 2, it was understood that flatness of silicon wafers polished by the polishing pads that the addition ratio of the silicone-based surfactant to a water ratio of 0.1 was set in a range of 0.015 to 0.065, namely, the polishing pad A (addition ratio: 0.05) of Example 1 and the polishing pad B (addition ratio: 0.03) of Example 2 can stabilize the shape of the silicon wafer and improve flatness to a high degree. While, the polishing pad D (Control 2) that the addition ratio of the silicone-based surfactant was set to 0.01 (less than 0.015) showed a tendency that flatness of the silicon wafer was deteriorated. This is considered that the water absorption percentage was lowered because the addition ratio is too small and accordingly the silicone-based surfactant cannot mix sufficiently with the water which is mixed for forming the foams. Further, from the measurement results, it was confirmed that the water absorption percentage and SFQR(max) are correlated.

As explained above, it was found that the foamed structure in which the foams 3 are communicated by the communication holes 9 can be formed by adding the silicone-based surfactant at the ratio of the predetermined range when the urethane sheet 2 is formed by a dry molding method. It was made clear that the polishing pad 10 using such the urethane sheet 2 can improve polishing performance and flatness of a silicon wafer.

INDUSTRIAL APPLICABILITY

Because the present invention provides a polishing pad capable of improving an affinity to polishing liquid and stabilizing polishing performance, a manufacturing method of the polishing pad and a polishing method using the polishing pad, the present invention contributes to manufacturing and marketing of a polishing pad. Accordingly, the present invention has industrial applicability.

What is claimed is:

1. A polishing pad in which a large number of foams are formed by a dry molding method and which has a resin foamed body where opened pores of the foams are formed at a polishing surface for polishing an object to be polished,
    wherein communication holes are formed between the foams formed adjacently to each other at the resin foamed body,
    wherein the communication holes are formed at a ratio of 800 holes/cm$^2$ or more per unit area when observed from a side of the polishing surface,
    wherein the resin foamed body is formed as a sheet having a thickness in a range of from 0.5 mm to 1.5 mm, and wherein a water absorption percentage expressed by a percentage of a change in a weight of the resin foamed body before and after the resin foamed body is dipped into water of 20 deg. C. to a weight of the resin foamed body before dipped is (31-16a) % or more when dipped for one hour and (56-24a) % or more when dipped for 24 hours, wherein "a" is the thickness of the resin foamed body.

2. The polishing pad according to claim 1, wherein the communication holes are formed at a ratio of 2000 holes/cm$^2$ or less per unit area when observed from the side of the polishing surface.

3. The polishing pad according to claim 1, wherein the resin foamed body is formed so as to have an apparent density in a range of from 0.30 g/cm$^3$ to 0.80 g/cm$^3$, a Shore A hardness in a range of from 75 deg. to 95 deg. and an average pore diameter of the opened pores formed at the polishing surface in a range of from 90 μm to 130 μm.

4. The polishing pad according to claim 3, wherein the resin foamed body is formed by a polyurethane resin.

5. A manufacturing method of a polishing pad in which a large number of foams are formed by a dry molding method and which has a resin foamed body where opened pores of the foams are formed at a polishing surface for polishing an object to be polished, wherein communication holes are formed between the foams formed adjacently to each other at the resin foamed body, and wherein the communication holes are formed at a ratio of 800 holes/cm$^2$ or more per unit area when observed from a side of the polishing surface, the method comprising the steps of:
    a preparing step for preparing each ingredient of an isocyanate-group containing compound obtained by reacting a polyisocyanate compound and a polyol compound, a polyamine compound, water and a foam control agent;
    a foamed body forming step for forming a polyurethane foamed body by a dry molding method from mixed liquid in which the each ingredient prepared in the preparing step is mixed approximately uniformly; and
    a slicing step for slicing the polyurethane foamed body formed in the foamed body forming step into sheet-shaped pieces.

6. The manufacturing method according to claim 5, wherein the foam control agent prepared in the preparing step is a silicone-based surfactant, and wherein a mixed ratio of the silicone-based surfactant is in a range of from 0.15 weight parts to 0.65 weight parts to one weight part of the water.

7. The manufacturing method according to claim 6, wherein the mixed ratio of the silicone-based surfactant is in a range of from 0.3 weight parts to 0.5 weight parts to one weight part of the water.

8. A polishing method of an object to be polished using the polishing pad according to claim 1, comprising the steps of:
    attaching the polishing pad to at least one of two plates disposed so as to face with each other at a polishing apparatus; and
    after setting the object to be polished between the plates, rotating at least one of the two plates while supplying polishing liquid in which abrasive grains are mixed between the object to be polished and the polishing pad.

9. The polishing method according to claim 8, wherein the object to be polished is a silicon wafer.

10. The polishing pad according to claim 1, wherein the resin foamed body is formed so as to have a Shore A hardness in a range of from 75 deg. to 95 deg.

* * * * *